United States Patent [19]

Fang et al.

[11] 4,092,553

[45] May 30, 1978

[54] JOSEPHSON LOGIC CIRCUIT POWERING ARRANGEMENT

[75] Inventors: Frank Fu Fang, Yorktown Heights; Dennis James Herrell, Somers, both of N.Y.

[73] Assignee: International Business Machines Corporation, Armonk, N.Y.

[21] Appl. No.: 661,600

[22] Filed: Feb. 26, 1976

[51] Int. Cl.² .................. H03K 3/38; H03K 19/195
[52] U.S. Cl. .................................. 307/306; 307/212; 307/277
[58] Field of Search ............... 307/208, 212, 277, 286, 307/299 R, 304, 306, 221 R; 357/2, 5

[56] References Cited

U.S. PATENT DOCUMENTS

| | | | |
|---|---|---|---|
| 3,185,862 | 5/1965 | Beesley | 307/306 X |
| 3,299,283 | 1/1967 | Harman | 307/221 R |
| 3,336,484 | 8/1967 | Ovshinsky | 307/299 X |
| 3,936,677 | 2/1976 | Fulton et al. | 307/306 |

Primary Examiner—John Zazworsky
Attorney, Agent, or Firm—Thomas J. Kilgannon, Jr.

[57] ABSTRACT

An alternating current powering arrangement for use with Josephson junction devices which have bilateral gain characteristics is disclosed. Using an alternating current input to a Josephson junction logic circuit, it is possible to carry out a desired binary logic function during one half of an alternating current cycle; reset the logic circuit; and carry out a different binary logic function during the second half of the alternating current cycle. In the instance of latching circuits, the Josephson junction logic circuits are reset by the passage of the alternating current (which is normally the gate current of the Josephson junction) through zero every half cycle. In the instance of self-resetting devices, the Josephson junctions normally reset themselves to the zero voltage state. Single phase and multiphase logic circuit powering arrangements are shown including a shift register arrangement which requires only two phases to achieve passage of information from the input to the output of the shift register. All of the arrangements shown include regulating means formed from a string of series connected Josephson junctions, the I-V characteristic of which effectively clips both positive and negative portions of the applied alternating current. Also included is a scheme for powering the logic gates with a constant voltage source and the parallel arrangement thereof which provides stable and isolated logic circuits. Under such circumstances, the maximum value of current applied to the logic circuits is carefully controlled and a plurality of logic circuits may be connected in cascade but isolated from each other across the regulator string. The logic circuits utilized are per se well known and may consist of terminated line logic circuits connected to a pair of low impedance buses via a single current defining resistance or via a pair of current defining resistances of value equal to R/2, where the value of R is large relative to the characteristic impedance of the power buses. Also shown are transformer means for applying AC current from an AC source to a logic circuit via board-to-module, module-to-chip and chip-to-logic circuit transformers.

15 Claims, 7 Drawing Figures

JOSEPHSON LOGIC CIRCUIT POWERING ARRANGEMENT

BACKGROUND OF THE INVENTION

1. Field of the Invention

This invention relates to alternating current powering of logic circuits which contain devices having bilateral gain characteristics. More particularly, it relates to an alternating current powering arrangement for Josephson junction logic circuits which have bilateral $I_g$-$I_c$ characteristics. Because of this bilateral characteristic, any group of Josephson junctions may be actuated to carry out a logic function during one half cycle of an alternating current powering cycle and a completely different logic function during the other half of the alternating current powering cycle. A feature of this arrangement is that where the Josephson junction logic devices are latching in character, the passage of the alternating current power through zero every half cycle resets each logic device so that it is automatically prepared for the next logical operation. Where the devices in question are non-latching self-resetting occurs without the benefit of the zero axis crossing but, in the same way as with latching logic circuits, the next logical operation is carried out on the succeeding half cycle of the alternating current powering arrangement. Using the AC powering approach, combinatorial logic can be carried out in the usual manner. Thus, in order not to lose information as a result of latching or non-latching operation of a given logic circuit, data can be preserved by transferring the data to a temporary storage register or the like. In the present instance, this can be most conveniently done by the expedient of multiphase operation in conjunction with other logic circuits which can be activated by a differently phased alternating current to hold the information after the original logic circuit resets. In addition, the use of alternating current powering provides built-in timing with logic circuits disposed at the same distance from the source having the same phase.

2. Description of the Prior Art

There is no known prior art which shows alternating current powering of Josephson junction logic circuits in which the Josephson junctions have bilateral gain characteristics. In the usual situation, Josephson logic circuits or any other circuit, for that matter, having bilateral characteristics, are operated by applying pulses of a single polarity with timing of the various logical operations being controlled from a separate timing or synchronizing source. Known circuit arrangements which incorporate field effect transistors, for example are non-latching in character inasmuch as they revert to their initial state once a control signal has been removed from an associated gate electrode. While there is an analogous non-latching situation associated with Josephson junction logic circuits, there is no known analogy to Josephson junctions (which are at least three terminal devices) operating in the latching mode. In the latter mode, after a control signal has been removed, the Josephson junction logic device remains in a switched condition until the gate current through the device is dropped below a minimum value of current In the self-resetting mode, there is no requirement in the Josephson junction environment for changing the value of gate current applied, and where latching circuits have been utilized and the gate current must be reduced to some minimum value for resetting, the approach has been to use pulses of a single polarity which are returned to zero.

With respect to the particular logic circuits and shift registers of the present application, it should be appreciated that the logic circuits utilized herein do not depart in any substantial way from those found in the prior art. The shift register disclosed herein, that exemplifies the AC powering technique, from a circuit point of view, is similar to prior art circuits, but the latter are operated with pulses of a single polarity and incorporate different expedients than taught by the present application to prevent race conditions. Typical prior art logic circuits includes U.S. Pat. No. 3,458,735, issued July 29, 1969 to M. D. Fiske, which shows a series string of Josephson junctions which, when each is activated, provides a given voltage equal to the sum of the voltage drops of all the switched Josephson devices.

Prior art shift register arrangements which appear to be relevant include IBM Technical Disclosure Bulletin, Vol.15, No.12, May 1973, p.3663, entitled "Three Phase Shift Register" by H. Hamel et al. This article shows a number of logic circuits each of which is identical to that disclosed in the present disclosure. However, the circuit of the article utilizes the expedient of an additional phase to prevent a race condition and operates in a pulsed power mode.

IBM Technical Disclosure Bulletin, Vol.16, No.7, December 1973, p.2405, entitled "Sequential Switch Using Josephson Junctions" by M. Klein, shows a switching arrangement in which each stage of a sequential switch is substantially identical with the logic circuit of the present application. The article shows the use of an intermediate stage between two other stages which could be said to be operating using two phases. The circuit shown, however, operates so that the pulses which activate different stages are in a non-overlapping mode. Hence, the requirement for the intermediate storage stage.

IBM Technical Disclosure Bulletin, Vol.16, No.5, October 1973, p.1466, entitled "Pseudo-Single Phase Josephson Tunneling Device Shift Register" by Y. L. Yao, shows a shift register arrangement wherein a gate current pulse and its complement are applied to the gates of first and second circuits, respectively. This circuit, however, incorporates a delay to overcome the possibility that the presence of an output current might cause the succeeding device to switch because the complementary current to that circuit does not drop to zero instantaneously. This article recognizes the possibility for the occurrence of a race condition, but solves it by the expedient of the delay. There is no suggestion of the use of alternating current to power such arrangements.

IBM Technical Disclosure Bulletin, Vol.15, No.3, August 1972, p.899, entitled "Josephson Junction Circuits Having Magnetic Feedback", by H. H. Zappe, shows a shift register arrangement wherein alternate DC pulses are applied to alternately disposed Josephson junction connected to the same bus. In this arrangement, the alternate pulses are of the same polarity and the logic circuits, while all in parallel, do not use current diverted into a parallel branch to control a succeeding circuit.

IBM Technical Disclosure Bulletin, Vol.17, No.9, February 1975, p.2791, entitled "Three-Phase Josephson Tunneling Device Shift Register" by F. F. Fang et al, shows a shift register containing circuits almost identical with that shown in the present application. However, the article utilizes three phases, only two of which are available at any give time. This enables the data to transfer from one stage to the next only. Thus, a third phase and a third circuit are required to operate the shift register of the article. While the article suggests that clipped sine waves may be utilized, it should be noted that the clipped sine waves are utilized instead of square waves and the powering to the circuit is in essentially a pulsed mode. FIG. 2 of the reference clearly indicated that the gate current never goes below the zero axis. Further, only one logic operation per cycle can be achieved in this approach. Thus, there is no teaching or indication in this publication that bilateral operation of Josephson devices is envisioned, requiring the use of gate currents which are affirmatively alternating in character.

IBM Technical Disclosure Bulletin, Vol.12, No.3, August 1969, p.440, entitled "A Shift Register Employing Josephson Junctions" by L. M. Terman, shows a two phase shift register in which all the devices associated with a given phase are connected in series. The shift register utilizes four Josephson devices per stage and includes the use of circulating currents to control the condition of devices in a succeeding group. There is no indication of the use of alternating currents nor of the use of the bilateral characteristics of Josephson junctions.

U.S. Pat. No. 3,123,720 to V. L. Newhouse et al, issued Mar. 3, 1964, shows a cryotron shift register which is similar to the arrangement of the present application. The shift register uses three devices per stage and utilizes circulating current in a parallel output loop which remains after the gate current has been terminated. This, in turn, requires the use of a reset pulse and control line to destroy the circulating current in a first circuit. While the result achieved is the same as in all shift registers, there is no hint or suggestion in this reference for the use of alternating currents.

IBM Technical Disclosure Bulletin, Vol.16, No.12, May 1974, entitled "Clocking Power Supply for Josephson Tunneling Circuits by Capacitive Coupling" by W. Anacker shows the transformer coupling of pulsed voltages to a string of Josephson devices.

From the foregoing, it should be clear that, while specific logic circuits, specific shift registers and the use of clipped sine waves have been suggested by the prior art, none of the prior art logic circuits or shift registers takes advantage of the bilateral characteristics of Josephson devices to provide for the alternating current powering of both logic and shift register circuits which may be latching or non-latching in character.

SUMMARY OF THE INVENTION

In accordance with the broadest aspects of the present invention, a logic circuit powering arrangement is provided which utilizes at least a single logic circuit including a bilateral switching device and, alternating current means connected to the logic circuit for switching and resetting the switchable device on each half cycle of said alternating current means.

In accordance with the broader aspects of the present invention, a logic circuit powering arrangement is provided which utilizes at least two logic circuits, each of which includes at least a switchable device having bilateral characteristics. Also included are alternating current means of at least two different phases connected to the two logic circuits for switching and resetting the switchable device on each half cycle of the alternating current means.

In accordance with the broader aspects of the present invention, a logic circuit powering arrangement is provided wherein the alternating current means of at least two different phases each includes transformer means coupled to each of the two logic circuits and a source of alternating current connected to each of the transformer means; the alternating current sources being of different phase.

In accordance with more specific aspects of the present invention, a logic powering arrangement is provided wherein one of the two logic circuits is a shift register, the stages of which are connected to the alternating current means of one of the at least two different phases and the other of the two logic circuits is a shift register the stages of which are connected to the alternating current means of the other of the at least two different phases. Further, the shift register stages connected to one phase are interleaved with the shift register stages connected to the other phase and the output of one stage is the input to a succeeding stage.

In accordance with still more specific aspects of the present invention, a logic circuit powering arrangement is provided wherein the transformer means includes at least four transformers interposed between each of the at least two logic circuits and each of the sources of alternating current. One transformer of the four transforms alternating current from the source to a board containing a plurality of modules. A second transformer transforms alternating current from the one transformer to each of the plurality of modules, each of which contains a plurality of chips. A third transformer transforms alternating current from the second transformer to each of the plurality of chips, each of which contains at least two logic circuits. Finally, a fourth transformer transforms alternating current from the third transformer to one of the at least two logic circuits.

In accordance with still more specific aspects of the present invention, a logic circuit powering arrangement is provided which further includes means for applying an input to the first stage of the stages of the shift registers and means connected to one of said one and the other of said shift registers for preventing a race condition in said shift registers when an input is applied to the first stage.

In accordance with still more specific aspects to the present invention, a logic circuit powering arrangement is provided wherein the means for preventing a race condition includes means for reversing the polarity of the outputs of the stages of the shift register which are connected to the alternating current means of the other of said at least two different phases relative to the outputs of the preceding stages of said shift register which are connected to the alternating current means of said one of said at least two different phases.

It is, therefore, an object of this invention to provide for the alternating current operation of at least a single logic circuit which includes a bilateral switching device.

Another object is to provide a logic circuit powering arrangement wherein the resetting of logic gates is ensured by the use of alternating current gate supplies.

Still another object is to eliminate the use of single polarity reset waveforms with attendant dispersion degradation which can result in poor or non-existent zero level resetting current when latching Josephson devices are used.

Still another object is to reduce resetting time by eliminating a relatively long down time which is required to ensure a good zero level following dispersion.

Still another object is to provide for the stepping up or down of the gate supply voltage and current via cascade and parallel current transformation using transformer action at each distribution point.

Still another object is to provide a relaxation of external power supply generator requirements.

Still another object is to provide a multi-phase shift register wherein the shift cycle is equal to one half the cycle time of the alternating current applied to the gates of individual devices.

Still another object is to be able to provide large amounts of current at the logic gate levels yet with convenient current and voltage levels at the source terminal to satisfy requirements for a parallel gate supply system which offers stability, speed and isolation.

Still another object is to provide synchronization of phases by ensuring that the electrical length of each supply branch is the same.

The foregoing and other objects, features and advantages of the invention will become apparent from the following more particular description of the preferred embodiments of the invention as illustrated in the accompanying drawings.

BRIEF DESCRIPTION OF THE DRAWINGS

FIG. 3 also includes a schematic of a regulator or clipping arrangement consisting of a string of Josephson junctions operating at their gap voltage in parallel with an alternating current supply such that a regulated constant voltage power bus can be established.

DESCRIPTION OF PREFERRED EMBODIMENTS

Figure 1:
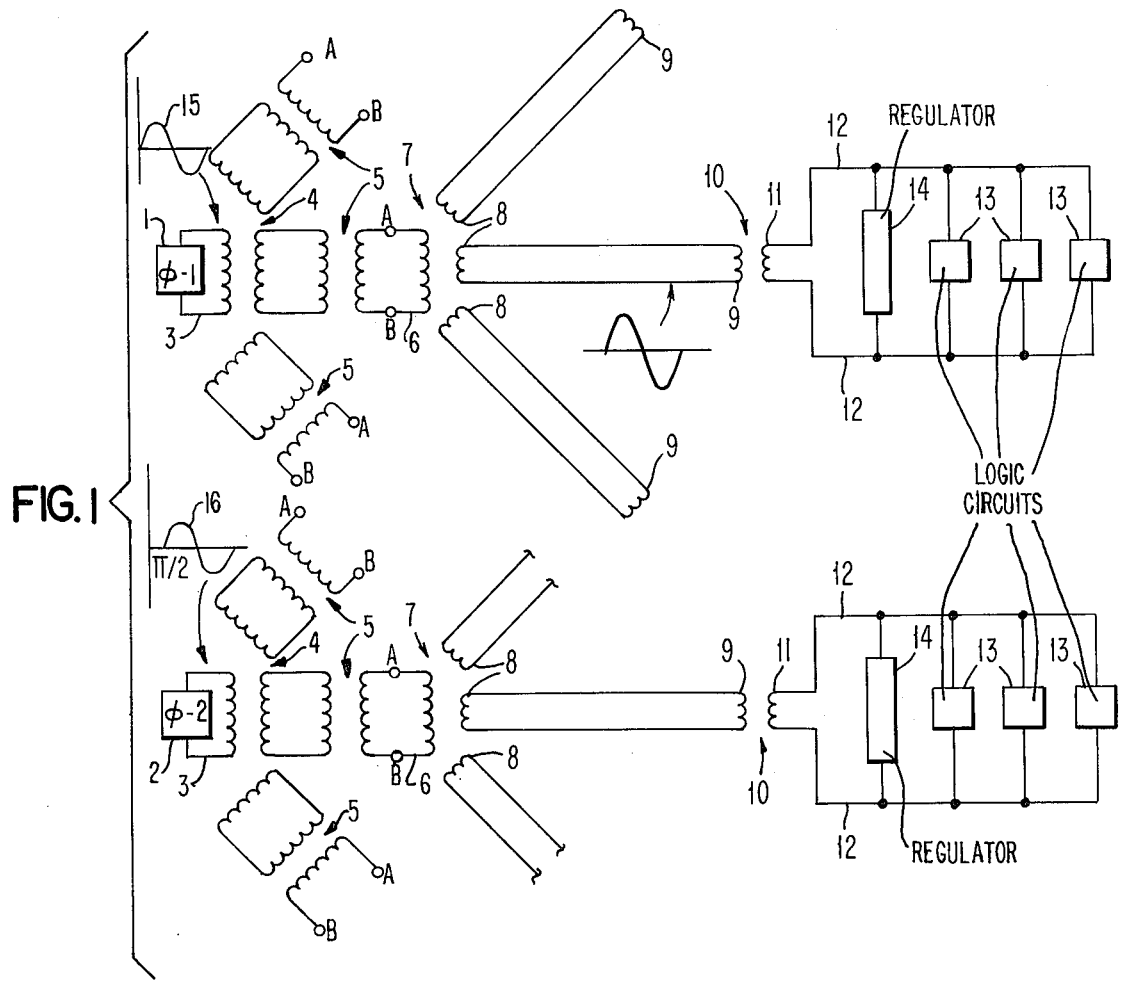
FIG. 1 shows a schematic diagram of a pair of logic circuits which are powered from AC sources of different phase via source-to-board, board-to-module, module-to-chip and chip-to-logic circuit transformers. Each of the logic circuits includes a regulator arrangement which clips the alternating current applied thereto and also includes at least a single switchable device which is capable of carrying out a logic function during each half cycle of alternating current.

Referring now to FIG. 1, there is shown a schematic diagram of a pair of logic circuits which are powered from AC sources of different phase via source-to-board board-to-module, module-to-chip and chip-to-logic circuit transformers. In FIG. 1, sources of AC power 1,2, otherwise identified in FIG. 1 as $\phi_1,\phi_2$, respectively, are shown connected to primaries 3 of source-to-board transformers 4. The secondaries of transformers 4 are shown connected to a plurality of board-to-module transformers 5; the secondaries of which are connected to points A,B which represent input terminals to modules which will be discussed in more detail hereinbelow. Terminals A,B are, in turn, connected to the primaries 6 of module-to-chip transformers 7. Primaries 6 are electromagnetically coupled to a plurality of secondaries 8 which, in turn, are connected to a plurality of primaries 9 of chip-to-logic circuit transformers 10. While only a pair of chip-to-logic circuit transformers 10 have been shown in FIG. 1, it should be appreciated that each of the primaries 9 is associated with a transformer 10 which has a secondary 11 connected to an associated logic circuit. Similarly, source-to-board transformers 4 and board-to-module transformers 5 can have a plurality of secondaries which, in turn, can be connected to a plurality of primaries of board-to-module transformers 5 and module-to-chip transformers 7, respectively. The number of logic circuits, chips modules and boards which can be fed by transformers 4,5,7,10 is limited only by practical considerations involved. Thus, a large number of logic circuits can be fed by a single phase alternating current. In FIG. 1, then, it should be appreciated that the schematic has been arranged for purposes of exposition and the particular arrangement is not intended to be limiting.

Chip-to-logic circuit transformers 10 have secondaries 11 the terminals of which are connected to distribution buses 12 across which are connected a plurality of logic circuits 13. In addition, regulators or clipping means 14 are shown disposed in parellel with secondaries 11 and logic circuits 13. Logic circuits 13 and regulator or clipping means 14 have been shown in FIG. 1 as blocks for purposes of illustration. Details of each of the particular circuits involved will be given hereinbelow in connection with FIGS. 3, 4.

While the approach of AC powering of logic circuits can be utilized at any frequency, it should be appreciated that the frequency of the alternating current applied where Josephson junction devices are the devices to be powered, can be of the order or in excess of 100 MHz giving an effective machine cycle of 5 nS to take advantage of the very high switching speed of Josephson devices.

While a circuit arrangement having only two phases has been shown in FIG. 1 for purposes of exposition, it should be appreciated that both single and multi-phase alternating current can be utilized without departing from the spirit of the present invention. A two-phase circuit, however, can be utilized to carry out all the combinatorial logic functions usually required in processing binary information. In a representative situation, alternating current represented by sine wave 16 and 90° out of phase with sine wave 15 could be utilized. While the implementation of FIG. 1 is directed to two circuits utilizing two phases, it should be appreciated that all the requirements for carrying out combinatorial logic can be met using only a single logic circuit powered by a single phase alternating current. Thus, where there is a requirement for retaining information which would normally be destroyed by the passing of the applied a.c. through zero, this requirement can be satisfied by transferring the information to be retained to some appropriate storage circuit such as a d.c. latch or memory register.

Figure 2:
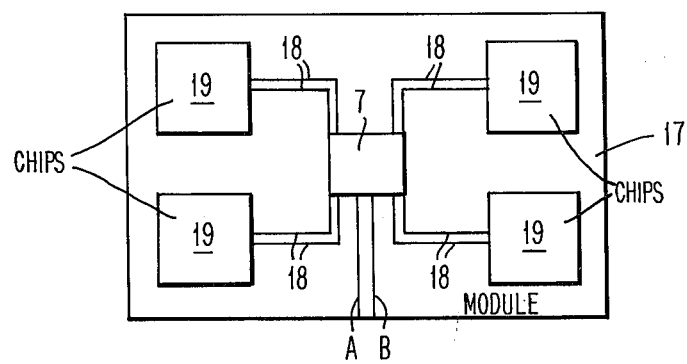
FIG. 2 is a pictorial representation of a module which contains a plurality of chips. The latter carry a plurality of logic circuits. This figure shows the distribution of AC power to individual chips via module-to-chip transformers having a single primary and one secondary per chip.

Referring now to FIG. 2, there is shown therein the distribution of alternating current power to individual chips via module-to-chip transformers having a single primary and one secondary per chip. Thus, in FIG. 2 terminals A,B disposed on the surface of module 17 connect to transformer 7 via a primary winding 6 (not shown). A plurality of secondaries 8 (not shown) extend via interconnections 18 to chips 19 diposed on the surface of module 17. Interconnections 18 connect to the primary 9 of transformer 10 (not shown) and a secondary 11 (not shown) is directly connected to a logic circuit 13 which is formed on the surface of chip 19 using well known integrated circuit techniques. Where the circuits in question must be superconducting because Josephson switching elements are utilized, the materials of module 17, interconnections 18 and chips 19 must be of such character as to withstand liquid helium temperatures (~4.2° K) and to permit superconductivity to occur in interconnections 18. One-to-one transformers (or transformers of other suitable ratio) having sufficiently high mutual inductance (approximately 500 picohenries) and a coupling coefficient in excess of 80% can be made with presently available Josephson technology using overlying lines passing over a hole in a ground plane. This latter approach is described in detail in U.S. Pat. No. 3,184,674 issued May 18, 1965 to R. L. Garwin, entitled "Thin Film Circuit Arrangement". The patent is assigned to the same assignee as the present invention. A major advantage of distributing power in the manner described in connection with FIGS. 1 and 2 and in the above mentioned patent is that current levels can be substantially reduced while at the same time minimizing the number of input/output pins required on the chip or module for power supplies. The reason for this is that, while individual transformers are 1:1 ratio for the primaries and the secondaries, the respective primaries can be serially connected. Thus, rather than having a large number of high current, low voltage power supplies, each individually connected to chips, the problem can be reduced to a few medium current, medium voltage power supplies.

Figure 3:
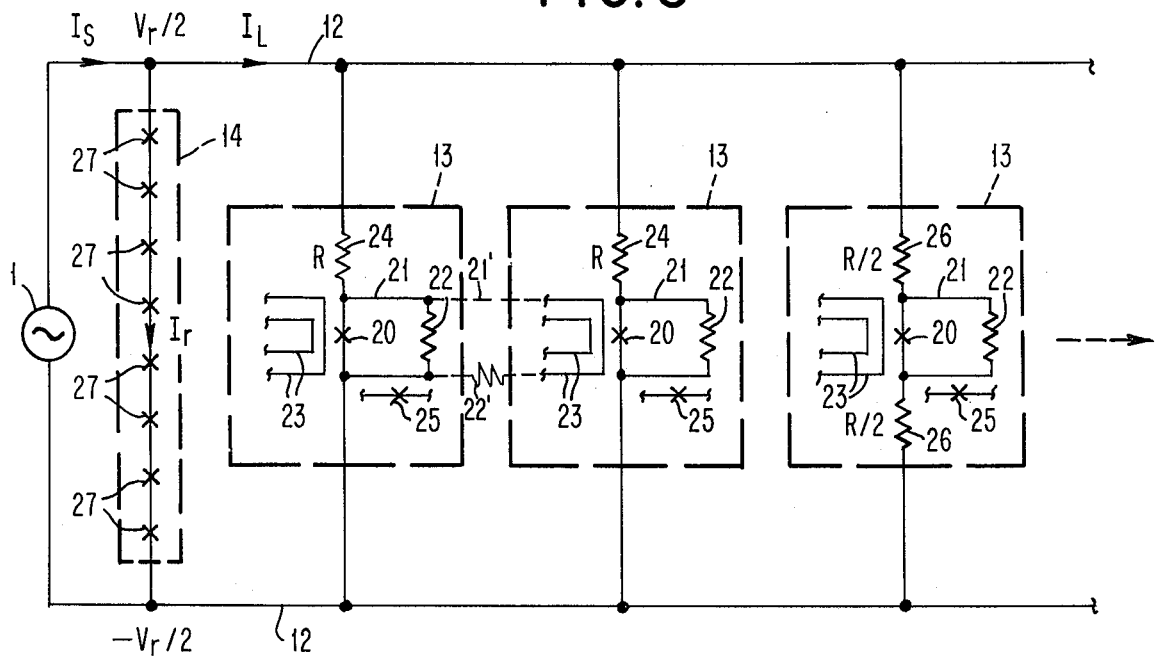
FIG. 3 shows a schematic diagram of an AC powering arrangement for a plurality of logic gates disposed in parallel. The logic circuits may be comprised of well known terminated line logic gates or a similar circuit wherein current defining resistances are interposed between the switchable gate and the connection to power buses.

FIG. 3 shows a schematic diagram of an AC powering arrangement for a plurality of logic gates disposed in parallel. Also shown is a schematic of a regulator or clipping arrangement consisting of a string of Josephson junctions operating at their gap voltage in parallel with an alternating current supply. In a preferred arrangement which utilizes Josephson junctions as switchable elements, a circuit like that shown in FIG. 3 may be utilized to supply AC power from a source 1 to a plurality of logic circuits 13 disposed in parallel with source 1.

One advantage of parallel powering of individual Josephson gates is that the system is extremely stable, free of switching disturbance, well regulated and well isolated. However, it usually requires a large amount of current at the logic circuit level. This problem is relieved by the AC powering scheme disclosed in this application. A regulator or clipping means 14 is shown disposed in parallel with source 1 in FIG. 3. At this point, it should be noted that dashed line boxes 13,14 of FIG. 3 show detailed schematics of logic circuits and regulator or clipping means which could be utilized in blocks 13,14, respectively, of FIG. 1. For convenience, an AC source 1 has been shown in FIG. 3 supplying blocks 13,14. It should be appreciated, however, that the parallel circuit arrangement of FIG. 3 would normally be powered via a transformer 10 and that logic circuits 13 would be disposed on a chip 19 similar to that schematically shown in FIG. 2.

Referring now to the leftmost dashed box 13 in FIG. 3, there is shown therein a well known Josephson terminated line logic (TLL) circuit consisting of a switchable Josephson device 20 shunted by a transmission line 21 and terminated by a resistance 22 which matches the characteristic impedance, $Z_o$, of transmission line 21. For present purposes, it should be assumed that switchable Josephson device 20, when switched, latches in that condition in a well known manner after control signals have been removed from an associated control line or lines. In FIG. 3, control lines 23 apply input signals to switchable Josephson device 20 which in combination with gate current $I_L$ permits device 20 to switch when the polarities of the incoming AC signal and the polarity of the control signals on control lines 23 are appropriate. Resistance 22 should be of such a value that device 20 remains latched when device 20 switches. Resistor 24 is a current limiting resistor otherwise shown in FIG. 3 as R. Gate current $I_L$ is supplied to logic circuits 13 via constant voltage power distribution buses 12 after the applied alternating current, $I_S$, is clipped by regulator or clipping means 14.

When current $I_L$ is applied in conjunction with appropriately poled control signals on control lines 23, device 20 switches, diverting current into transmission line 21 and resistor 22 in the usual well known manner. The existence of current in transmission line 21 is detected by a Josephson device 25 disposed in electromagnetically coupled relationship with a portion of transmission line 21. Current flowing in transmission line 21 acts as a control signal for Josephson device 15. The switching of gate 25 in response to current flow in transmission line 21 can be detected in well known ways by means not shown in FIG. 3. Device 25 is, of course, connected to a source of gate current with different phase also not shown.

Referring now to rightmost dashed line box 13 in FIG. 3, a symmetrical logic circuit arrangement useful in the practice of the present invention is shown. The circuit shown is similar in every respct to that described in connection with leftmost box 13 except that the circuit is connected to distribution buses 12 via current defining resistances 26 otherwise shown in FIG. 3 as R/2. Where distribution buses 12 are low impedance buses driven from an AC source 1, and where device 20 is disposed midway between buses 12, this circuit has the advantages that device 20 is well isolated from any other device 20 and the output line capacitance is not charged to any appreciable amount during the power on portion of the cycle. In addition, negligible common mode signals are experienced on the output lines.

The characteristic impedance of distribution buses 12 should be sufficiently small compared with the resistance value of 24 so that disturb signals of adjacent devices 20 are negligible, but not so small that appreciable displacement current is needed each cycle to charge and discharge the capacitance associated with buses 12. Series resistance 24 should be sufficiently large compared to the combination of the normal junction resistance of device 20 and the terminated load resistance 22, for stability reasons. For m gates on a parallel string, a value of impedance, $Z \cong R/m$ for the impedance of distribution buses 12 appears optimum. Various matching procedures at AC source 1 and the far end of the parallel string can be employed, but they yield very little advantage in speed and increase drastically the overall dissipation of the parallel string. It has been found preferable to connect the parallel string directly across source 1 and leave the far end open while at the same time minimizing as much as possible the overall length of distribution buses 12. The voltage of source 1 regulated by regulator means 14 may have a value of $V_r \cong I_g R$ where $I_g$ is the predetermined gate current and R is the series resistor 24. A typical value of R is a resistance of five to ten times the parallel combination of the normal junction resistance, $R_j$, of device 20 and resistance 22.

In connection with the logic circuits 13 shown in FIG. 3, it should be appreciated that control lines 23 may represent portions of transmission lines similar to transmission line 21 and that, as such, inputs may be applied from circuits identical to circuits 13. A dashed line 21' extending from the left-most circuit 13 to the middle circuit 13 of FIG. 3 interconnecting line 21 of the former and control line 23 of the latter shows this feature. The circuit is completed by connecting resistor 22' in left-most circuit 13 as shown. Also, it should be appreciated that Josephson device 25 may form a portion of another circuit 13 where device 25 is similar to device 20 and has a gate current supplied thereto which may be of a different phase. Thus, while one logic circuit 13 has its device 20 activated from a source of one phase, device 25 may be activated from an alternating current source of another phase, in a manner similar to that to be discussed hereinbelow.

FIG. 3 shows within dashed line box 14 a regulator or clipping means consisting of a plurality of Josephson gates 27 operating at the gap voltage, which provided a clipped, regulated voltage waveform to logic circuits 13 from AC source 1. Because of overshoot problems using linear ramp power supply voltage waveforms, the powering arrangement of FIG. 3 is utilized to minimize overshoot and to achieve good regulation of the supply voltage. To achieve this, Josephson junctions 27 are biased at the gap voltage thereof during the power up portion of the alternating current cycle. Under these conditions, a sinusoidal input power waveform can be applied to regulator means 14 to provide the desired output to logic circuits 13 of FIG. 3. Thus, current $I_S$ superimposed on the I-V characteristic for the string of junctions 27 provides an output current $I_L$ in a manner described in connection with FIG. 4. While Josephson devices operating at the gap voltage have been shown as a preferred embodiment, it should be appreciated that any device having a well-defined current step at a finite voltage may be utilized.

Figure 4:
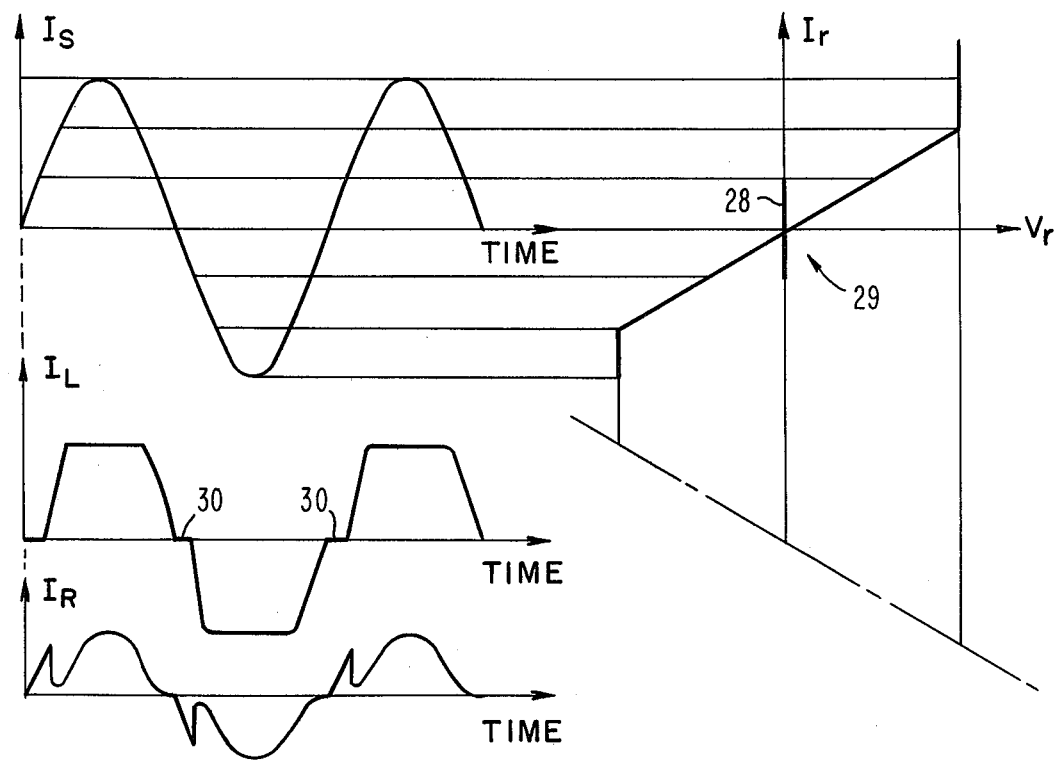
FIG. 4 shows schematically the sinusoidal input current wave form to the arrangement of FIG. 3 with the resultant load and regulator currents using a linearized I-V characteristic for the regulator string junctions.

FIG. 4 shows an input current waveform, $I_S$ (sinusoidal with a frequency of 100 MHz for a logic cycle time of 5 ns), with the resultant load current, $I_L$ (gate supply current to logic circuits 13), and regulator current, $I_R$, using a linearized I-V characteristic for the regulator string junctions 27. It should be noted in FIG. 4 that the current delivered to logic circuits 13, $I_L$ rises rapidly with no overshoot to a well defined level and that the Josephson supercurrent portion 28 of the regulator characteristic 29 provides clearly defined regions 30 at $I_L=0$, which ensures affirmative resetting of Josephson devices 20 of logic circuits 13. The duration of portion 30 of waveform $I_L$ can be adjusted by varying the $I_m(I_c)$ [gain curve] of regulator 14.

Figure 5:
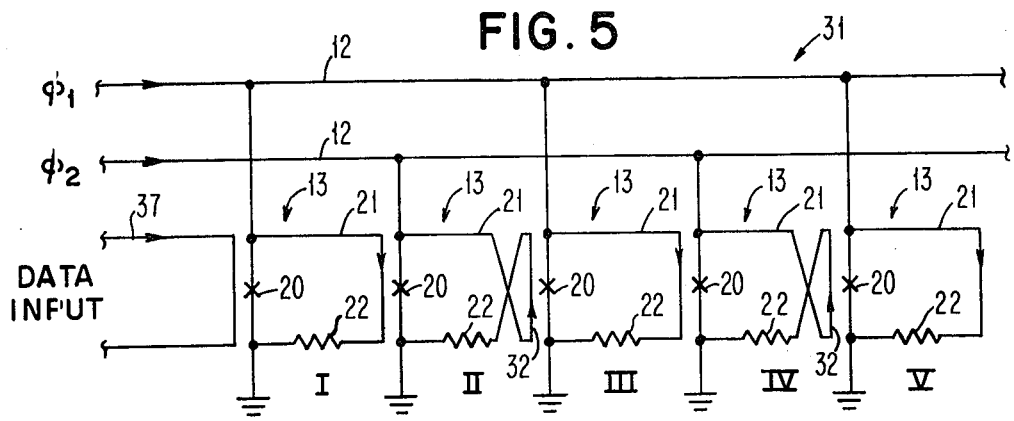
FIG. 5 is a schematic diagram which illustrates the design of a shift register operating in a two-phase mode, defined by $\phi_1$ and $\phi_2$. With power supply waveforms $\phi_1$ and $\phi_2$ generated as shown in FIG. 4, from input sinusoidal waveforms with a relative phase difference of $\pi/2$, a shift cycle equal to one half of the sine wave cycle time can be realized. In the arrangement shown, data can be transferred from $\phi_1$ to $\phi_2$ when $\phi_1$ and $\phi_2$ are of the same polarity, whereas the transfer from $\phi_2$ to $\phi_1$ occurs when $\phi_1$ and $\phi_2$ are of opposite polarity.

As indicated hereinabove and suggested by the waveform output supplied to logic circuits 13 of FIG. 3, Josephson junctions in the combinatorial logic environment can be designed to operate irrespective of the polarity of the gate supply current applied to all logic gates provided that the polarity is instantaneously the same for all logic gates or devices in a particular logic circuit. Special single input OR-INVERTER gates must be interposed between phases in a multi-phase circuit to ensure error-free, race-free operation. An example of how this can be accomplished is shown schematically in FIG. 5 wherein the design of a shift register operating in a two-phase mode is shown. With power supply waveforms $\phi_1$, $\phi_2$ similar to waveforms 15,16, respectively, of FIG. 1, applied to respective parallel strings of logic circuits 13 and their associated regulator means 14, waveforms similar to waveform $I_L$ of FIG. 4 are generated which have a relative phase difference of $\pi/2$. Under such circumstances, a shift cycle equal to one half of the sine wave cycle time is achieved. FIG. 5 shows a schematic diagram of a shift register 31 which indicates that Josephson combinatorial logic can operate regardless of the polarity of the gate supply current applied. To relate the concept of FIG. 5 to the overall concept suggested in FIG. 1, where relevant, the same reference characters as used in FIG. 1 have been utilized for similar elements in FIG. 5.

In FIG. 5 distribution buses 12 supply waveforms similar to $I_L$ of FIG. 4 and further denoted as $\phi_1$, $\phi_2$ in FIG. 5 to separate parallel arrangements of logic circuits 13. For purposes of explanation, each successive logic circuit 13 has been designated by Roman numerals I-V to relate the waveforms of FIG. 7 to a particular stage of the shift register shown. Each of the logic circuits 13 of FIG. 5 is similar to the leftmost circuit 13 of FIG. 3 and the same reference characters for switchable device 20, transmission line 21 and resistor 22 have been utilized in FIG. 5. In FIG. 5, a portion of transmission line 21 of each of the circuits 13 acts as a control line for the next succeeding logic circuit. Thus, the output of stage I of shift register 31 acts as the input to stage II of shift register 31 and so on. In FIG. 5, a portion of transmission line 21, designated 32 in stages II,IV is connected in such a way to transmission line 21 that the current flow direction relative to the next device 20 is effectively reversed. As will be seen hereinbelow, this permits the storage of information in a logic circuit associated with one phase until a succeeding phase assumes the same polarity as the polarity of current flowing in portion 32.

Figure 6:
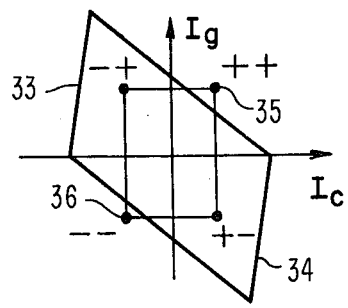
FIG. 6 illustrates the operating points on a non-linear, inline gate gain curve for a switchable device in the shift register of FIG. 5.

FIG. 6 shows the operating points on a non-linear, in-line gate gain curve for switchable devices 20 in shift register 31 of FIG. 5. FIG. 6 indicates that a Josephson device 20 having bilateral asymmetrical gain curves 33,34 can be utilized to provide switching when both the gate current ($I_g$) and the control current ($I_c$) in a device 20 are both of the same polarity be it positive or negative. In FIG. 6, points 35,36 are representative of a switched condition of a device 20 when gate currents and control currents of the same polarity are applied to a device. While gain curves 33,34 have been shown to be asymmetrical in FIG. 6, it should be appreciated that symmetrical gain curves could be utilized to achieve a similar result but currents of different amplitude for positive and negative excursions would have to be used to ensure switching only when the gate and control currents are of the same polarity.

Figure 7:
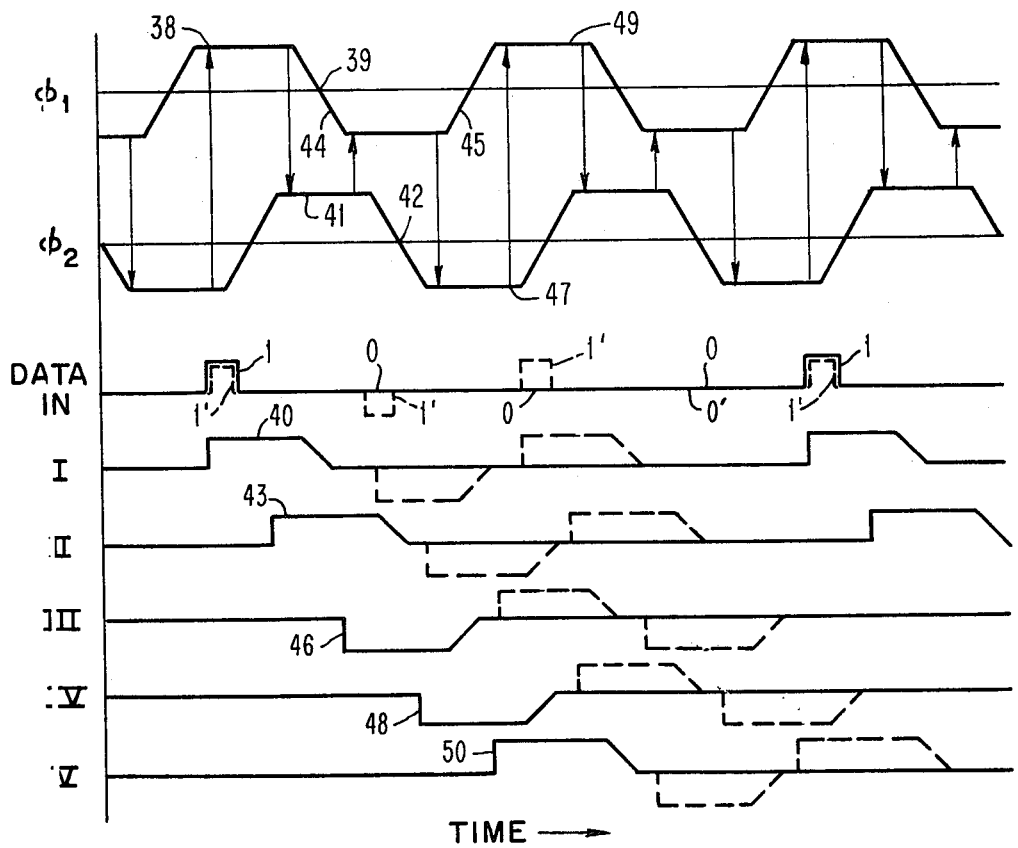
FIG. 7 shows the shifting of a "10001" pattern and a "11101" pattern in the solid and broken line waveforms, respectively, when these signals are applied to the circuit of FIG. 5 along with alternating currents of $\phi_1$, $\phi_2$.

Referring now to FIG. 7, the waveforms $\phi_1$, $\phi_2$, which are applied to distribution buses 12 of shift register 31 of FIG. 5 are shown. These waveforms are similar to the waveforms $I_L$ shown in FIG. 4 and are obtained in a similar manner. In addition, the shifting of a "10001" pattern and a "11101" pattern is depicted in FIG. 7 and is otherwise identified therein as "DATA IN" along with waveforms which represent the current flow conditions in stages I–V when these binary patterns are applied to the input 37 of shift register 31.

In FIG. 7 the binary data "10001" are shown as solid line waveforms whereas the binary data "11101" are shown as dashed line waveforms. Also, the data flow direction is shown by arrows in FIG. 7, indicating that when $\phi_1$ and $\phi_2$ are of the same polarity there is a transfer of information between $\phi_1$ and $\phi_2$ and when $\phi_1$ and $\phi_2$ are of different polarity there is a transfer of information between $\phi_2$ and $\phi_1$.

The operation of shift register 31 can be understood as follows:

Assuming that alternating currents $\phi_1,\phi_2$ of FIG. 7 are applied to respective distribution buses 12 of FIG. 5, and further assuming that a binary 1 input represented by the leftmost of the "DATA IN" pulses in FIG. 7 is applied to input 37 of shift register 31 of FIG. 5, when $\phi_1$ goes positive as indicated at 38 in FIG. 7, device 20 of stage I of shift register 31 of FIG. 5 switches to the voltage state in a well known manner, diverting current into transmission line 21. Since device 20 of stage I remains latched, current flows in transmission line 21 as soon as $\phi_1$ goes positive and continues to flow in transmission line 21 until $\phi_1$ returns to zero as indicated on $\phi_1$ of FIG. 7 at 39. The current flow condition is indicated at 40 in the waveforms of FIG. 7 labeled I. Since waveforms $\phi_1,\phi_2$ are phase shifted relative to one another by 90°, when $\phi_2$ goes positive, as indicated in FIG. 7 at 41, the combination of current 40 (acting as an input to device 20 of stage II) and current 41 applied to stage II switches device 20 to the voltage state, diverting current into its associated transmission line 21. Current continues to flow in transmission line 21 of stage II until $\phi_2$ returns to zero as indicated at 42 in FIG. 7. The current flow in transmission line 21 of stage II is indicated at 43 in the waveforms of FIG. 7 labeled II. Since the next succeeding stage III is activated by $\phi_1$, it should be apparent that an undesired race condition could result if the expedient utilized in stage II were not undertaken. Thus, if all the stages I–V were identical, as soon as leftmost DATA IN pulse of FIG. 7 were applied and $\phi_1$ went positive, the data would ripple through shift register 31 in a race condition because each input to each of devices 20 would be positive at the same time a positive going gate current 38 appeared on the $\phi_1$ distribution bus 12 of FIG. 5. To prevent this race condition, transmission lines 21 of stages II,IV of FIG. 5 are connected in such a way that the direction of current which would normally flow in transmission line 21 is reversed. Under such circumstances and in accordance with the ground rules shown in FIG. 6, when $I_g$ is positive and $I_c$ is negative (due to the reversal of a portion of transmission line 21, and indicated at 32 in FIG. 5) device 20 associated with stage III cannot switch until it encounters signals of the same polarity, either positive or negative.

The required condition for the switching of device 20 of stage III of shift register 31 is fulfilled, however, when $\phi_1$ goes negative as shown at 44 in FIG. 7. Under these conditions, device 20 of stage III switches to the voltage state and negative going current is diverted into transmission line 21 and remains there until $\phi_1$ returns to zero as indicated at 45 in FIG. 7. Waveform 46 associated with the waveform labeled III in FIG. 7 shows this condition. Ninety degrees after the onset of waveform 44 in FIG. 7, $\phi_2$ goes negative as indicated at 47 in FIG. 7. Because negative control current as indicated at 46 in FIG. 7 is flowing in transmission line 21 of stage III, device 20 of stage IV does not switch until $\phi_2$ goes negative. When it does, device 20 of stage IV switches and negative current, represented by waveform 48 in the waveforms labeled IV in FIG. 7 flows in transmission line 21. However, because of the reversal of the output, an effectively positive current flows in portion 32 of transmission line 21 of stage IV of shift register 31. In this manner, a new race condition is prevented and device 20 of stage V cannot switch until $\phi_1$ goes positive as indicated at 49 in FIG. 7. When $\phi_1$ goes positive, that current, in combination with the now positive current flowing in 32 of stage IV, causes device 20 of stage V to switch and current represented by waveform 50 of the waveforms otherwise labeled V in FIG. 7 flows in transmission line 21.

From the foregoing, it should be clear that the shift cycle is one half a cycle of the applied gate current and that two phase alternating current operation is achieved by the expedient of reversing the output leads of logic circuits associated with the second phase to provide an effective reversal of current flow. Also, from what has been discussed in connection with the leftmost binary bit of information, it should be apparent how the remaining bits of information are shifted through stages I–V of shift register 31. In this connection, it should be noted that, when a negative DATA IN pulse is applied to part 37 of shift register 31, it is applied during a portion of the alternating current cycle when $\phi_1$, for example, is negative.

The various elements utilized in the circuits shown in the drawings have not been described in detail because, in and of themselves, they form no part of the present invention. To the extent that any teaching is required, let it suffice to say that the Josephson devices, logic circuits, interconnections, resistors and the like can be fabricated by well known photolithographic and etching techniques in combination with well known deposition techniques. The materials utilized in the Josephson junction environment should be superconducting metals which are well known to those skilled in the cryogenic arts.

While no emphasis has been placed on non-latching Josephson devices in the foregoing descriptions, it should be appreciated that, wherever latching Josephson devices have been described, non-latching Josephson devices can be easily substituted without departing from the spirit of the teaching of the present invention.

Also, it should be appreciated that, while the teaching of the present invention has been preferably illustrated in the Josephson environment, this teaching is not intended to be limiting and that devices having bilateral characteristics similar to Josephson devices could be advantageously used as a substitute.

While the invention has been particularly shown and decribed with reference to preferred embodiments thereof, it will be understood by those skilled in the art that the foregoing and other changes in form and details may be made therein without departing from the spirit and scope of the invention.

What is claimed is:

1. A logic circuit powering arrangement comprising:
   a at least a single chip,
   at least a single logic circuit including a bilateral switchable device capable of carrying Josephson current disposed on said at least a single chip,
   alternating current means connected to said logic circuit for applying alternating current to said switchable device the amplitude of which is insufficient to switch said switchable device,
   means electrically connected to said switchable device for controlling the switching thereof, and,
   regulating means disposed on said at least a single chip in parallel with said alternating current means.

2. A logic circuit powering arrangement according to claim 1 further including output means connected to said switchable device for detecting the switching of said device.

3. A logic circuit powering arrangement according to claim 1 wherein said alternating current means includes transformer means coupled to said logic circuit and a source of alternating current connected to said transformer means.

4. A logic circuit powering arrangement according to claim 1 wherein said switchable device is a device which latches in the switched state when switched.

5. A logic circuit powering arrangement according to claim 1 wherein said switchable device is a device which is self-resetting when switched.

6. A logic circuit powering arrangement according to claim 1 wherein said means for controlling includes at least a single control line electromagnetically coupled to said switchable device.

7. A logic circuit powering arrangement according to claim 1 wherein said means for controlling includes a logic circuit similar to said logic circuit the output of which is electromagnetically coupled to said switchable device.

8. A logic circuit powering arrangement according to claim 1 wherein said regulating means includes at least a single device having a well defined current step at a finite voltage.

9. A logic circuit powering arrangement according to claim 1 wherein said regulating means includes at least a single device capable of carrying Josephson current operating at the gap voltage thereof.

10. A logic circuit powering arrangement according to claim 1 wherein said regulating means includes a plurality of devices capable of carrying Josephson current operating at the gap voltage thereof disposed in series with each other.

11. A logic circuit powering arrangement according to claim 2 wherein said output means for detecting includes a logic circuit similar to said logic circuit the input of which is electromagnetically coupled to said logic circuit.

12. A logic circuit powering arrangement according to claim 2 wherein said output means for detecting includes another switchable device and at least a portion of said logic circuit electromagnetically coupled to said another switchable device.

13. A logic circuit powering arrangement according to claim 3 wherein said transformer means includes a transformer secondary connected to said logic circuit and a transformer primary coupled to said secondary and said source of alternating current.

14. A logic circuit powering arrangement according to claim 6 wherein said transformer means includes at least four transformers interposed between said at least a logic circuit and said source of alternating current, one transformer of which transforms alternating current from said source to a board containing a plurality of modules, a second transformer of which transforms alternating current from said one transformer to each of said plurality of modules each of which contains said at least a single chip, a third transformer of which transforms alternating current from said second transformer to said at least a chip which contains said at least a logic circuit, and a fourth transformer of which transforms alternating current from said third transformer to said at least a logic circuit.

15. A logic circuit powering arrangement according to claim 2, wherein said output means includes temporary storage means for retaining information developed by said logic circuit during a half cycle of said alternating current and prior to the initiation of the succeeding cycle of said alternating current.

* * * * *